United States Patent
Murata et al.

(10) Patent No.: US 10,239,101 B2
(45) Date of Patent: Mar. 26, 2019

(54) PURGE DEVICE AND METHOD OF DIFFUSING GAS INCLUDING PURGE GAS

(71) Applicant: MURATA MACHINERY, LTD., Kyoto-shi, Kyoto (JP)

(72) Inventors: Masanao Murata, Mie (JP); Mitsuya Tokumoto, Aichi (JP); Takashi Yamaji, Mie (JP)

(73) Assignee: MURATA MACHINERY, LTD., Kyoto (JP)

( * ) Notice: Subject to any disclaimer, the term of this patent is extended or adjusted under 35 U.S.C. 154(b) by 243 days.

(21) Appl. No.: 15/100,758

(22) PCT Filed: Dec. 17, 2014

(86) PCT No.: PCT/JP2014/083439
§ 371 (c)(1),
(2) Date: Jun. 1, 2016

(87) PCT Pub. No.: WO2015/114981
PCT Pub. Date: Aug. 6, 2015

(65) Prior Publication Data
US 2016/0296984 A1 Oct. 13, 2016

(30) Foreign Application Priority Data
Jan. 29, 2014 (JP) .................................. 2014-014614

(51) Int. Cl.
*B08B 9/08* (2006.01)
*B08B 5/00* (2006.01)
*H01L 21/67* (2006.01)
*H01L 21/673* (2006.01)
*H01L 21/677* (2006.01)

(52) U.S. Cl.
CPC .................. *B08B 9/08* (2013.01); *B08B 5/00* (2013.01); *H01L 21/67017* (2013.01); *H01L 21/67389* (2013.01); *H01L 21/67769* (2013.01)

(58) Field of Classification Search
CPC ....... B08B 9/08; B08B 5/00; H01L 21/67769; H01L 21/67017; H01L 21/67389
See application file for complete search history.

(56) References Cited

U.S. PATENT DOCUMENTS

| 2002/0006675 A1 | 1/2002 | Shigaraki |
| 2014/0014227 A1 | 1/2014 | Shin et al. |

FOREIGN PATENT DOCUMENTS

| JP | 2001-326162 A | 11/2001 |
| JP | 2006-13210 A | 1/2006 |
| JP | 2013-140893 A | 7/2013 |

OTHER PUBLICATIONS

Official Communication issued in International Patent Application No. PCT/JP2014/083439, dated Mar. 24, 2015.
English translation of Official Communication issued in corresponding International Application PCT/JP2014/083439, dated Mar. 24, 2015.

*Primary Examiner* — David Redding
(74) *Attorney, Agent, or Firm* — Keating & Bennett, LLP

(57) ABSTRACT

A purge device includes an internal space defined by a chassis, and performs a purge process where an inside of a storage container in the internal space with an article being accommodated is purged with a purge gas. The purge device includes an air blower that is located outside the chassis, and sends air to an area where a gas including the purge gas in the internal space leaks through an opening in the chassis so as to diffuse the gas including the purge gas leaking from the opening.

4 Claims, 6 Drawing Sheets

PURGE DEVICE AND METHOD OF DIFFUSING GAS INCLUDING PURGE GAS

BACKGROUND OF THE INVENTION

1. Field of the Invention

The present invention relates to a purge device that includes an internal space defined by a chassis, and performs a purge process where an inside of a storage container arranged in the internal space is purged by using a purge gas such as an inert gas or clean dry air, and a method of diffusing the gas including the purge gas that leaks from the purge device.

2. Description of the Related Art

There has been known a purge device that maintains cleanliness by placing a storage container, in which a semiconductor wafer, a glass substrate, or the like is accommodated, in an internal space defined by a chassis and introducing a purge gas into the storage container placed in this internal space (i.e., a so-called purge process). In such a purge device, countermeasures have been taken to prevent an operator from experiencing oxygen deficiency by ventilating the internal space of the purge device to maintain oxygen concentrations of the internal space at a predetermined value. For example, Japanese Patent Application Laid-Open Publication No. 2001-326162 discloses a technique where blowing dry air at least ensures oxygen concentrations in a certain area of the internal space.

However, in order to increase the number of storage containers placed in the internal space and cope with the increasing size of articles subject to the purge process, the flow rate of the purge gas has been increased in recent years. The purge device is enlarged to attain oxygen concentrations with a predetermined value, resulting in its complex configuration.

SUMMARY OF THE INVENTION

Preferred embodiments of the present invention provide a purge device capable of ensuring operator safety using a simplified configuration and method of diffusing the gas including the purge gas.

According to a preferred embodiment of the present invention, a purge device includes an internal space defined by a chassis, and performs a purge process where an inside of a storage container arranged in the internal space with an article being accommodated is purged with a purge gas. The purge device includes an air blower that is located outside the chassis, and sends air to an area where a gas including the purge gas in the internal space leaks through an opening in the chassis, and diffuses the gas including the purge gas leaking from the opening.

"Air sent by the air blowers" here means gas with an oxygen ($O_2$) concentration at such a level that an operator does not experience oxygen deficiency.

In such a purge device, as the air blower sends air towards the gas including the purge gas leaking from the opening in the chassis, the gas including the purge gas is diffused by the sent air. This lowers the concentration of purge gas, which prevents an operator from experiencing oxygen deficiency. Furthermore, since this purge device only requires equipment capable of sending air towards the gas including the purge gas blown out from the openings in the chassis, its configuration is simplified, compared to equipment where the oxygen concentration is kept to a predetermined value throughout the inside of the chassis. As a result, this simplified configuration ensures the safety of an operator.

In a preferred embodiment of the present invention, the air blower may send air along a surface of the chassis where the opening is located.

Such a purge device is capable of suppressing the gas including the purge gas flowing in a direction perpendicular or substantially perpendicular to the surface of the chassis where it is assumed that an operator is present. Accordingly, the safety of operators is secured with more certainty.

An air blower according to a preferred embodiment of the present invention may be provided so as to surround the peripheral edge of the opening, and may send air in a direction perpendicular or substantially perpendicular to an opening surface at the opening.

Such a purge device is capable of diffusing the gas including the purge gas from a position closer to the opening, enabling more certain diffusion of the purge gas.

A method of diffusing a gas including a purge gas according to a preferred embodiment of the present invention includes diffusing the gas including the purge gas leaking from the purge device, in a purge device that includes an internal space defined by a chassis, and performs a purge process where an inside of a storage container arranged in the internal space with an article being accommodated, is purged with a purge gas. Air is sent from an outside of the chassis to an area where a gas including the purge gas in the internal space leaks through the opening in the chassis so as to diffuse the gas including the purge gas leaking from the opening.

In such a method, as air is sent towards the gas including the purge gas leaking from the openings in the chassis, the gas including the purge gas is diffused by the sent air. This lowers the concentration of the purge gas, which prevents an operator from experiencing oxygen deficiency. Furthermore, when air is sent to the gas including the purge gas, since the purge device only requires equipment capable of sending air towards the gas including the purge gas blown out from the openings in the chassis, its configuration is simplified, compared to equipment where the oxygen concentration is kept to a predefined value throughout the inside of the chassis. As a result, this simplified configuration ensures the safety of an operator.

According to various preferred embodiments of the present invention, operator safety is ensured by using a simplified configuration.

The above and other elements, features, steps, characteristics and advantages of the present invention will become more apparent from the following detailed description of the preferred embodiments with reference to the attached drawings.

DETAILED DESCRIPTION OF THE PREFERRED EMBODIMENTS

Preferred embodiments of the present invention will be explained hereinafter with reference to the drawings. In the description of the drawings, the same reference signs are given to the same elements to omit duplicated explanation. The dimension ratio of the drawings does not always match each other.

Figure 1:
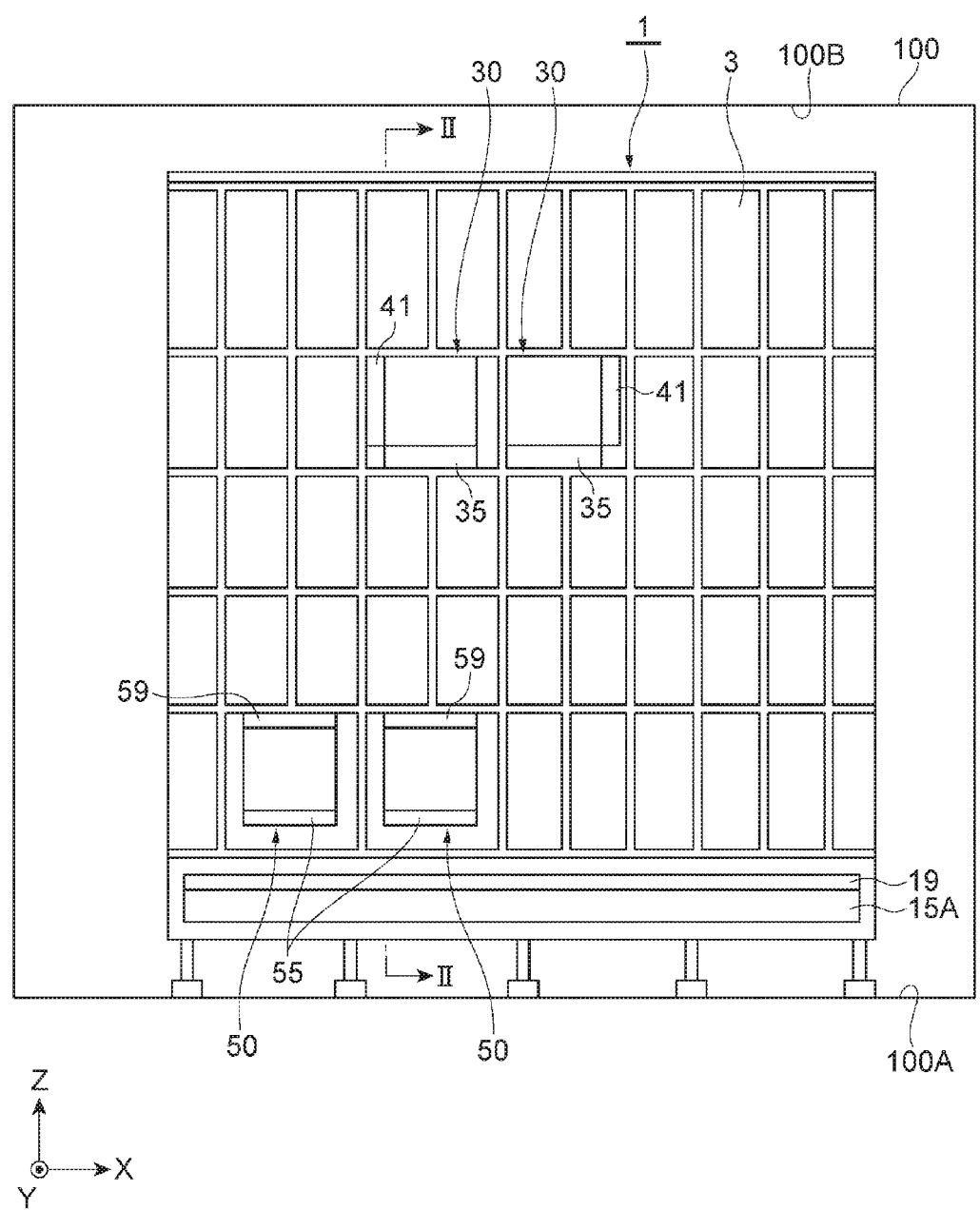
FIG. 1 is a front view illustrating a purge stocker according to a preferred embodiment of the present invention.
Figure 2:
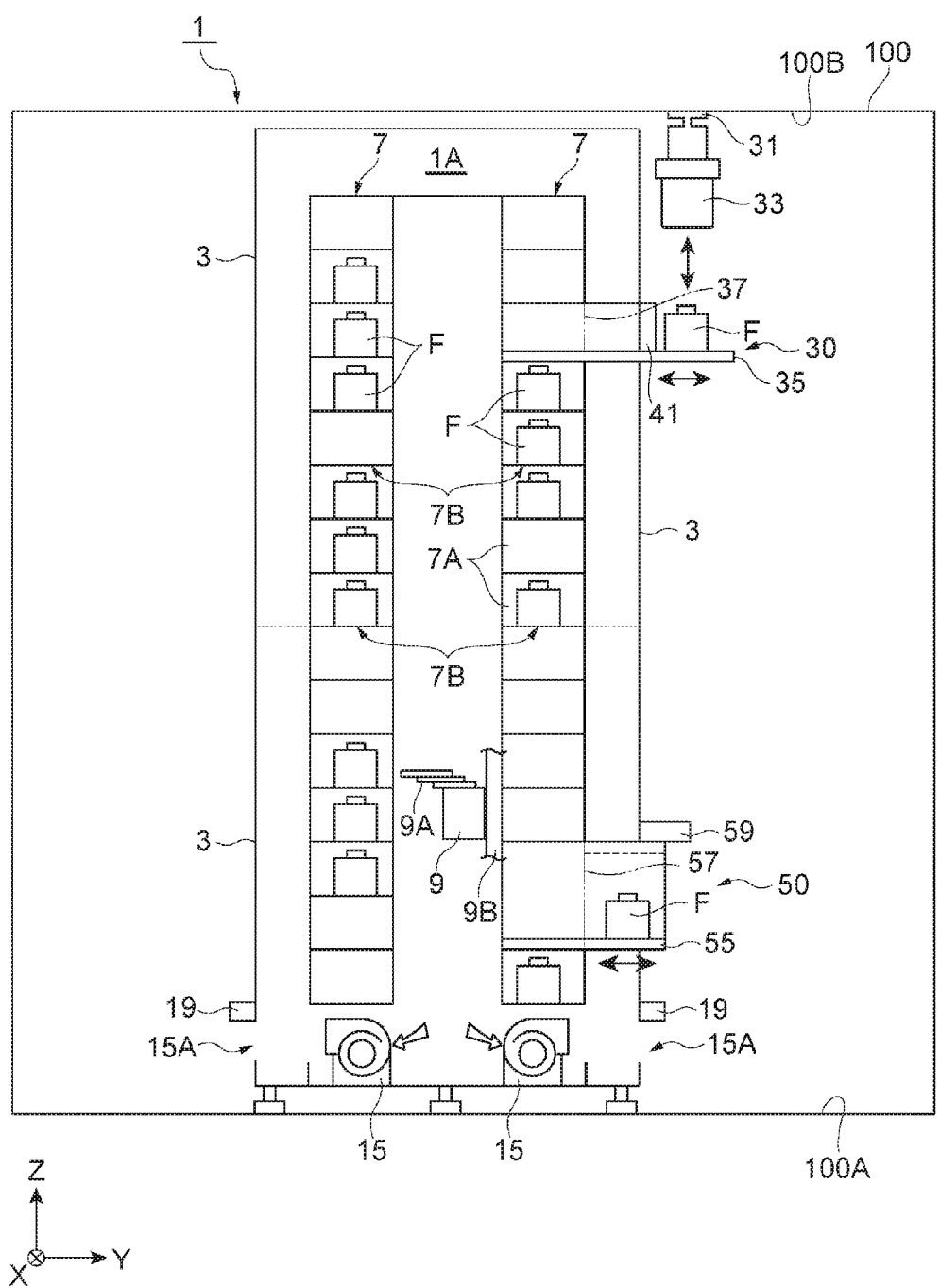
FIG. 2 is a cross-sectional view of the purge stocker taken along the line II-II of FIG. 1.

A purge stocker (purge device) 1 according to a preferred embodiment of the present invention is described below. As shown in FIGS. 1 and 2, the purge stocker 1 includes a purge portion 7B in which the inside of a storage container F such as a FOUP (Front Opening Unified Pod) where an article including a semiconductor wafer or a glass substrate is accommodated is purged with a purge gas, and a storage area 1A that serves as an internal space to store a plurality of storage containers F. As illustrated in FIGS. 1 and 2, the purge stocker 1 is, for example, installed in a clean room 100.

The purge stocker 1 installed in such a clean room 100 is equipped with a partition (chassis) 3, a rack 7, and a crane 9. The purge stocker 1 also may include an exhaust fan 15.

The partition 3 separates (defines) an area above floor 100A, and the storage area (internal space) 1A is located inside the partition 3. The rack 7 stores a storage container F and includes an array of multiple rows (here, two rows) set in the storage area 1A. Each rack 7 is extended in a predetermined direction X, and two rows of racks 7 are arranged to face each other in a depth direction Y. Each rack 7 includes a plurality of storage shelves 7A that each store the storage container F along a predetermined direction X and a vertical direction (vertical and horizontal) Z.

The storage shelve 7A of rack 7 includes a purge portion 7B where the inside of the storage container F to be placed is purged using the purge gas (nitrogen gas, for example). More specifically, the purge portion 7B is a device to supply/discharge the purge gas into the storage container F placed on the storage shelve 7A. The purge portion 7B includes a gas supply tank (not illustrated), a plurality of gas supply pipes (not illustrated), and a plurality of gas discharge pipes (not illustrated). The gas supply tank, for example, has nitrogen ($N_2$) gas inside. A plurality of gas supply pipes extend from the gas supply tank to the mounting surface of each storage shelf 7A. A plurality of gas discharge pipes extend from the mounting surface of each storage shelf 7A. Additionally, a flow regulator (such as a Mass Flow Controller or valve) (not illustrated) and an on-off valve (not illustrated) are installed in the middle of the gas supply pipes.

The crane 9 transports the storage container F into and out of the storage shelve 7A, and is located in the area between racks 7, which face each other. The crane 9 runs on a traveling rail (not illustrated) installed on the floor along an extending direction X of rack 7 so as to move along the extending direction X of rack 7. A loading platform 9A on the crane 9 is able to be raised and lowered along a guide rail 9B, and is capable of transporting the storage container F into and out of a plurality of storage shelves 7A which are placed in a vertical direction Z.

The exhaust fans 15 are provided at the bottom of the storage area 1A, and discharge the gas including the purge gas from the inside of the storage area 1A to the outside of the storage area 1A via exhaust ports (openings) 15A.

The storage container F is transported into and out of the purge stocker 1 from an OHT (Overhead Hoist Transfer) port (opening) 30 and a manual port (opening) 50. The OHT port 30 is located on one side of the purge stocker 1 (front side illustrated in FIG. 1), and is a section where the storage container F transferred from an overhead traveling vehicle 33 that runs on a traveling rail 31 placed on the ceiling 100B is transported into and out of the stocker. The OHT port 30 is equipped with a conveyor 35 to transport the storage container F between the inside of the purge stocker 1 (storage area 1A) and the outside, and a retractable shutter 37 that closes off the inside of the purge stocker 1 from the outside. When the overhead traveling vehicle 33 places the storage container F on the conveyor 35, the shutter 37 of the purge stocker 1 is opened. Once the storage container F is stored inside the purge stocker 1, the shutter 37 is closed. On the other hand, in the storage area 1A of the purge stocker 1, when the crane 9 places the storage container F on the conveyor 35, the shutter 37 is opened. Once the storage container F is taken outside the purge stocker 1, the shutter 37 is closed.

The manual port 50 is a section where the storage container F is transferred between an operator and the purge stocker 1. The manual port 50 is located at the position where an operator is able to access the manual port 50 on one side of the purge stocker 1 (front side illustrated in FIG. 1). The manual port 50 is equipped with a conveyor 55 to transport the storage container F between the inside of the purge stocker 1 (storage area 1A) and the outside, and a retractable shutter 57 to close off the inside of the purge stocker 1 from the outside. When an operator places the storage container F on the conveyor 55, the shutter 57 is opened. Once the storage container F is stored inside the purge stocker 1, the shutter 57 is closed. On the other hand, in the inside of the purge stocker 1, when the crane 9 places the storage container F on the conveyor 55, the shutter 57 is opened. Once the storage container F is discharged outside the purge stocker 1, the shutter 57 is closed.

Such a purge stocker 1 is provided with an opening where the purge gas leaking from the storage container F leaks from the inside (storage area 1A) of the purge stocker 1 to the outside. In the purge stocker 1 of this preferred embodiment, the OHT port 30, manual port 50, and exhaust port 15A correspond to the openings. At the opening from which the gas including the purge gas leaks, countermeasures are required to prevent an operator who accesses the area from experiencing oxygen deficiency.

The purge stocker 1 of this preferred embodiment is provided with a fan (air blower) 59 that is located outside of the space (storage area 1A) divided by the partition 3 and sends air to the area where the gas including the purge gas leaks from opening of the partition 3, and diffuses the gas including the purge gas leaking from the opening.

Figure 3A:
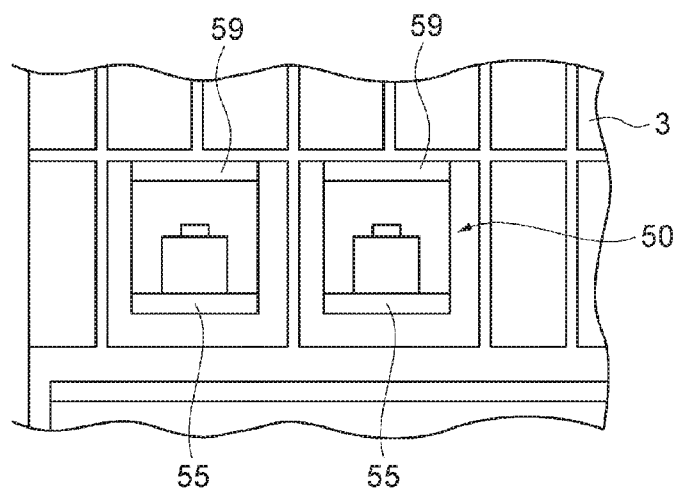
FIGS. 3A and 3B are an enlarged front view and an enlarged cross-sectional view illustrating the vicinity of manual ports in FIG. 1.
Figure 3B:
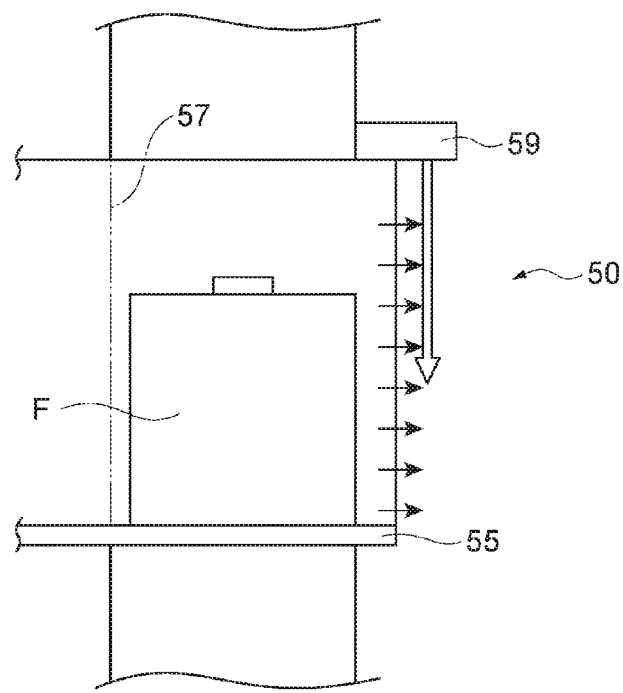

With the use of FIGS. 3A and 3B, the fan 59 that diffuses the gas including the purge gas leaking from the manual ports 50 which make up one of the openings is described in detail below.

The fan 59 is located outside the space divided by the partition 3, and is also installed in the vicinity of and above the manual port 50. The fan 59 sends air along the surface of the partition 3 where the manual port 50 is located, more specifically, in the downward direction shown in FIGS. 3A and 3B. As the fan 59 sends air (an unshaded arrow) towards the gas including the purge gas leaking from the manual port 50 (solid line arrows indicated in FIGS. 3A and 3B), the gas including the purge gas is diffused by the sent air.

Figure 4A:
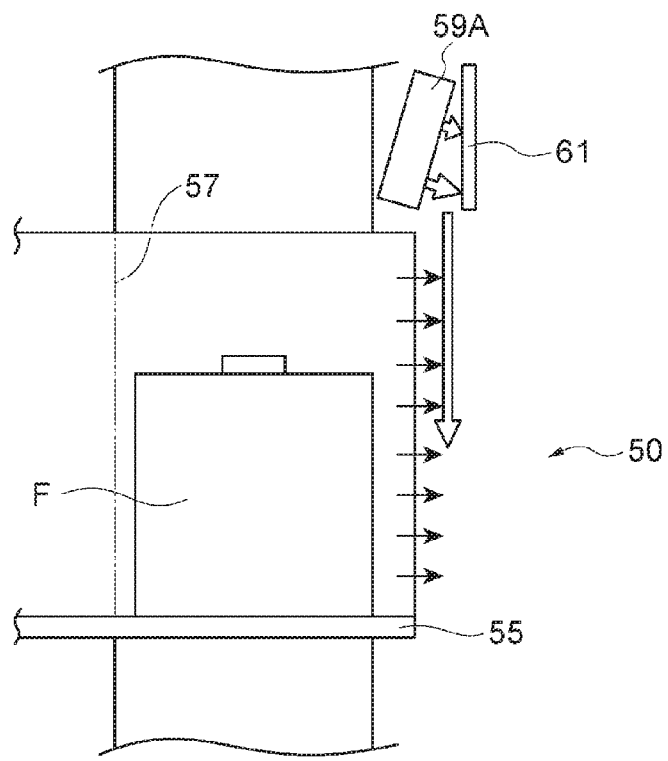
FIGS. 4A and 4B are cross-sectional views respectively illustrating the overview configuration of an air blower according to one alternative preferred embodiment and another alternative preferred embodiment of the present invention.

The fan defining and functioning as an air blower in the purge stocker 1 is not only configured to be placed in the vicinity of and above the manual port 50 as mentioned above, but as illustrated in FIG. 4A, the fan may also take the configuration where the combination of a fan 59A and a flow regulating plate 61 is used. In this case, the direction of the air sent by the fan 59A is able to be adjusted by the flow regulating plate 61, and thus, regardless of the direction in which the air is intended to be sent, for example, as shown in FIG. 4A, the fan may be set in an oblique direction. Such a configuration of the fan 59A is effective when there is a limitation on the direction in which the fan may protrude from the partition 3, or the like.

Figure 4B:
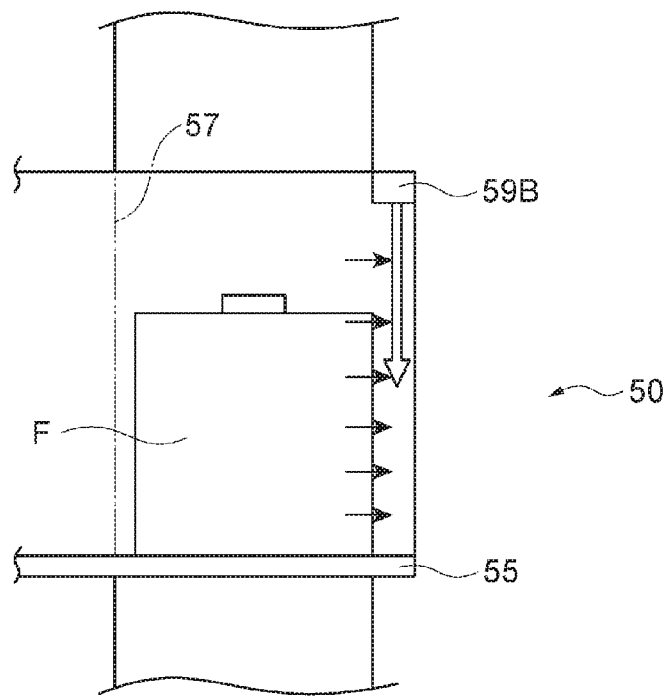

Alternatively, in the configuration where a fan defines and functions as an air blower ins the purge stocker 1, as illustrated in FIG. 4B, a fan 59B may be located outside of the storage area 1A (that is, outside of the shutter 57) and also inside of the manual port 50. Such a configuration of the fan 59B is effective when there is a limitation on the direction in which the fan may protrude from the partition 3, or the like.

In the purge stocker 1 of this preferred embodiment, as illustrated in FIG. 1, fans (air blowers) 41 and 19 are installed respectively in the vicinity of the OHT port 30 and the exhaust port 15A which are the openings other than the manual port 50. The fan 41 is placed on at least one of the lateral sides of the OHT port 30 (side of an X-axis direction shown in FIG. 1). The fan 19 is placed in the vicinity of and above the exhaust port 15A. Since the fans 41 and 19 arranged in this manner send air towards the gases including the purge gases that leak from the OHT port 30 and the exhaust port 15A respectively, the gases including the purge gases are diffused by the air being sent.

The advantageous effects brought by the purge stocker 1 of the aforementioned preferred embodiment are described below. According to the purge stocker 1 of the aforementioned preferred embodiment, since the fan 59 sends air towards the gas including the purge gas that leaks from the manual port 50, the gas including the purge gas is diffused by the sent air. This lowers the concentration of purge gas, which prevents operators from experiencing oxygen deficiency. The fans 41 and 19 are respectively installed in the OHT port 30 and the exhaust port 15A, thus obtaining the similar effects.

The conventional purge stocker 1 is configured to effectively take in a down flow from a FFU (Fan Filter Unit) installed on the ceiling 100B in the clean room 100, to have the FFU used exclusively for the purge stocker installed, or the like in order to ventilate the entire storage area 1A to always satisfy the predetermined oxygen concentrations. However, in order to increase the number of storage containers F placed in the storage area 1A and cope with the increasing size of articles being accommodated (an article subject to the purge process), the flow rate of the purge gas has been increased in recent years. The purge device is enlarged to attain oxygen concentrations with a predetermined value, resulting in its complex configuration. In contrast, according to the purge stocker 1 of the aforementioned preferred embodiment, if an operation commences where entering the inside of the purge stocker 1 is not allowed at a time other than when the prescribed conditions are put in practice, the purge device only requires equipment capable of sending air towards the gas including the purge gas being blown out from the manual port 50 (OHT port 30 and exhaust port 15A). Thus, its configuration is simplified, compared to equipment where the oxygen concentration is kept to a predetermined value throughout the inside of the partition 3. As a result, this simplified configuration ensures the safety of an operator.

Since the fan 59 sends air along the surface of the partition 3 where the manual port 50 is provided, the gas including the purge gas is suppressed or prevented from flowing in a direction at right angles to the surface of the partition 3 where it is assumed that an operator is present. Accordingly, the safety of operators is secured with more certainty. The fans 41 and 19 also send air along the surface of the partition 3 where the manual port 50 is provided, and thus similar advantageous effects are obtained.

An explanation of preferred embodiments of the present invention is described above. However, the present invention is not limited to the aforementioned preferred embodiments, and various alterations, modifications, combinations, etc. may be made within the scope of the present invention.

First Alternative Preferred Embodiment

In the aforementioned preferred embodiment, the purge stocker 1 is illustrated using the example where each of the OHT port 30, the manual port 50, and the exhaust port 15A include the fans 41, 59 and 19 installed respectively. However, the present invention is not limited to this. The OHT port 30, the manual port 50 and the exhaust ports 15A which an operator is at least likely to access, may include a fan (air blower.

Second Alternative Preferred Embodiment

Figure 5A:
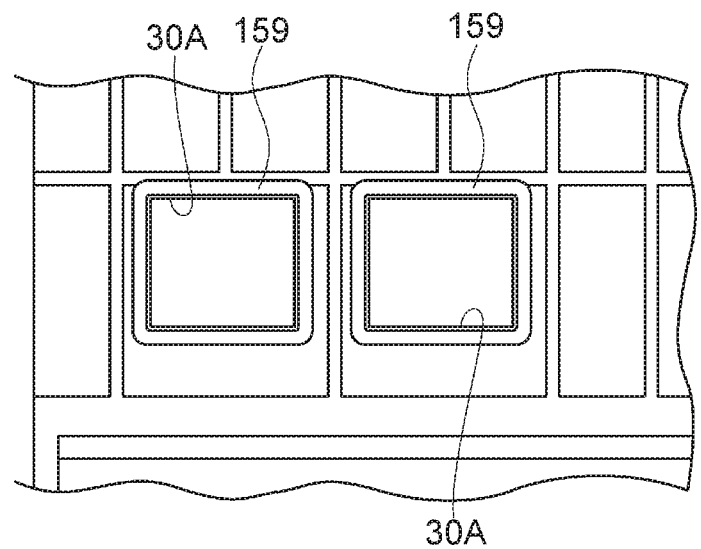
FIGS. 5A and 5B are a front view and a cross-sectional view illustrating the overview configuration of an air blower according to one alternative preferred embodiment of the present invention.
Figure 5B:
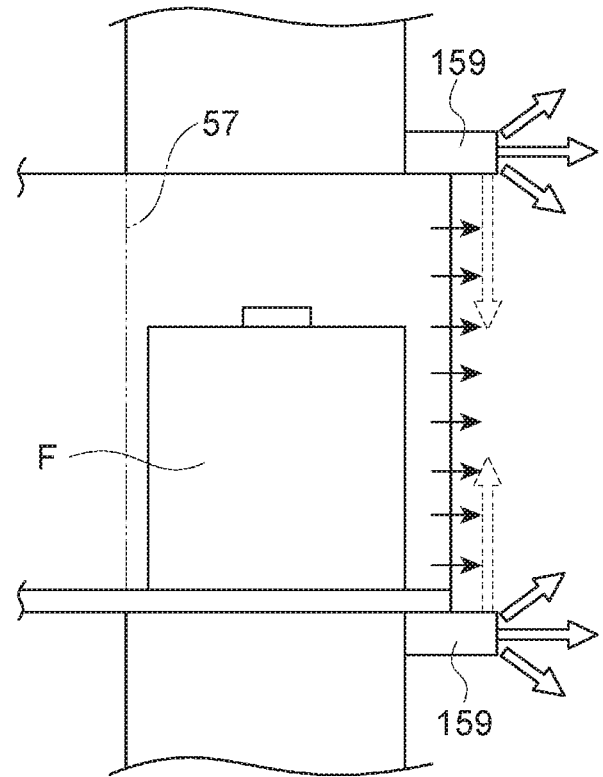

In the aforementioned preferred embodiment and alternative preferred embodiment, the purge stocker 1 is provided with fans 41, 59 (59A, 59B) and 19 placed in the vicinity of each OHT port 30, manual port 50, and exhaust port 15A which serves as an opening, and is illustrated using the example where air is sent to the surface direction of the partition 3. However, the present invention is not limited to this. For example, as shown in FIGS. 5A and 5B, a fan (air blower) 159 is provided so as to surround the peripheral edge 30A of the OHT port 30 (possibly manual port 50 and exhaust port 15A) which serves as an opening and may be at least configured to send air in a direction perpendicular or substantially perpendicular to the opening surface of the OHT port 30 (manual port 50 and exhaust port 15A) (unshaded arrows indicated in FIG. 5B). Air may be configured to be sent not only in a direction perpendicular or substantially perpendicular to the opening surface but also in a direction along the opening surface (unshaded arrows with dotted lines indicated in FIG. 5B). The purge stocker 1 with such a configuration is capable of diffusing the gas including the purge gas from a position closer to the OHT port (opening) 30, enabling more certain diffusion of the purge gas.

Third Alternative Preferred Embodiment

Figure 6:
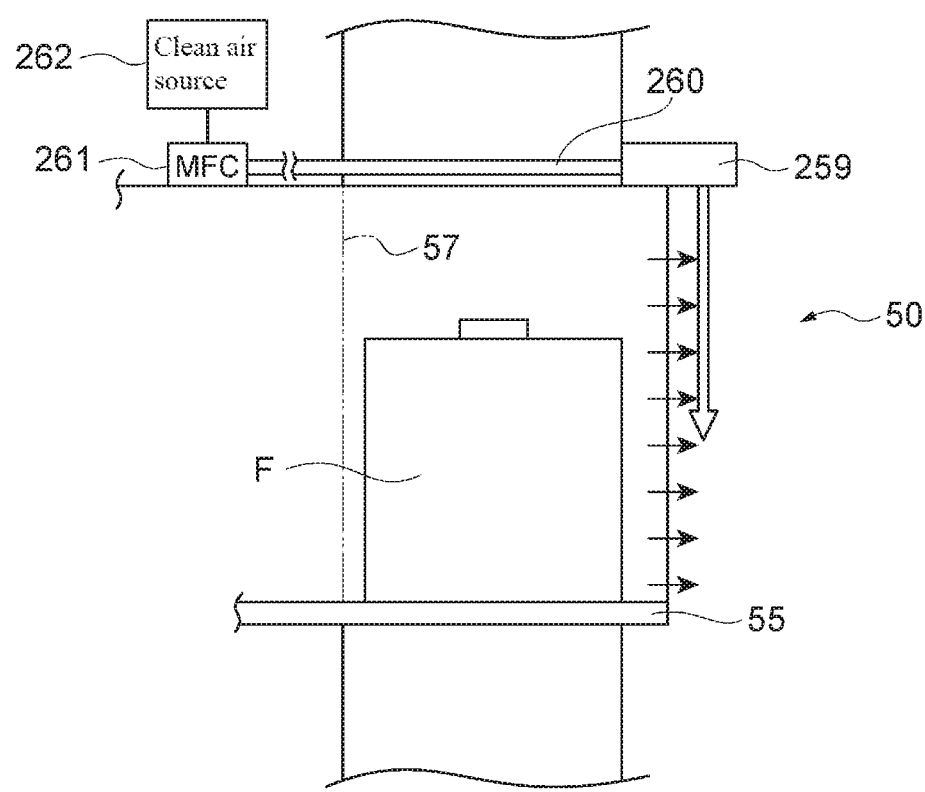
FIG. 6 is a cross-sectional view illustrating the overview configuration of the air blower according to one alternative preferred embodiment of the present invention.

In the aforementioned preferred embodiment and alternative preferred embodiment, the purge stocker 1 is explained with the example where fans 41, 59 (59A, 59B), and 19 are provided as an air blower; however, the present invention is not limited to this. For example, a plurality of nozzles 259 that eject clean air (for example, air containing a predetermined oxygen concentration) may be placed as an air blower to diffuse the gas including the purge gas that leaks from each OHT port 30, manual port 50, and exhaust port 15A. In such a case, for example, as illustrated in FIG. 6, a clean air source 262 where clean air is stored may be installed to send the clean air via a duct 260. Furthermore, a MFC (Mass Flow Controller) 261 may also be installed to control the flow rate of the clean air sent from the nozzle 259. Instead of a plurality of nozzles, a jet outlet that includes a plurality of slits or holes may be provided as an air blower.

Other Alternative Preferred Embodiments

The purge stocker 1 may include an opening where a fan is installed as an air blower and an opening where a nozzle is installed as an air blower. For example, in the purge stocker 1, the manual port 50 may be provided with a nozzle as an air blower, and the OHT port 30 and the exhaust port 15A may be provided with a fan as an air blower.

The aforementioned preferred embodiment describes the purge device with an example of the purge stocker 1; however, the present invention is not limited to this. Various preferred embodiments of the present invention may be applied to a device (such as a load port containing a purge function) that possesses an opening where gas including purge gas leaks from the space defined by a partition or the like.

In the explanation mentioned above, a method of diffusing the gas including the purge gas leaking from the purge device is explained using the example where the purge stocker (purge device) 1 of the aforementioned preferred embodiment is used; however, the present invention is not limited to this. For example, for the purge stocker 1 that has an opening from which gas including purge gas leaks, an air blower other than that of the purge stocker 1 may be installed to diffuse the gas including the purge gas leaking from the openings.

While preferred embodiments of the present invention have been described above, it is to be understood that variations and modifications will be apparent to those skilled in the art without departing from the scope and spirit of the present invention. The scope of the present invention, therefore, is to be determined solely by the following claims.

The invention claimed is:

1. A purge device that includes an internal space defined by a chassis, and performs a purge process in which an inside of a storage container in the internal space and having an article accommodated therein is purged with a purge gas, the purge device comprising:
    an air blower that is located outside the chassis, and sends air to an area where a gas including the purge gas in the internal space leaks through an opening in the chassis so as to diffuse the gas including the purge gas leaking from the opening.

2. The purge device according to claim 1, wherein the air blower sends air along an outside surface of the chassis where the opening is provided.

3. The purge device according to claim 1, wherein the air blower surrounds a peripheral edge of the opening, and at least sends air in a direction perpendicular to an opening surface of the opening.

4. A method of diffusing a gas including a purge gas leaking from a purge device including an internal space defined by a chassis that includes an opening, the purge device performs a purge process in which an inside of a storage container in the internal space and having an article accommodated therein is purged using the purge gas, the method comprising:
    sending air from an air blower that is located outside the chassis to an area where the gas including the purge gas in the internal space leaks through the opening in the chassis so as to diffuse the gas including the purge gas leaking from the opening.

* * * * *